United States Patent
Bauchart et al.

(10) Patent No.: US 12,150,283 B2
(45) Date of Patent: Nov. 19, 2024

(54) COOLING ASSEMBLY FOR A DATA CENTER RACK AND METHOD FOR ASSEMBLING A RACK SYSTEM

(71) Applicant: OVH, Roubaix (FR)

(72) Inventors: Gregory Francis Louis Bauchart, Wattrelos (FR); Samy Bousaber, Paris (FR); Ali Chehade, Moncheaux (FR)

(73) Assignee: OVH, Roubaix (FR)

( * ) Notice: Subject to any disclaimer, the term of this patent is extended or adjusted under 35 U.S.C. 154(b) by 165 days.

(21) Appl. No.: 17/890,878

(22) Filed: Aug. 18, 2022

(65) Prior Publication Data

US 2023/0067935 A1 Mar. 2, 2023

(30) Foreign Application Priority Data

Aug. 30, 2021 (EP) ..................................... 21306166

(51) Int. Cl.
 *H05K 7/20* (2006.01)
(52) U.S. Cl.
 CPC ..... *H05K 7/20781* (2013.01); *H05K 7/20136* (2013.01); *H05K 7/20263* (2013.01); *H05K 7/2039* (2013.01); *H05K 7/20736* (2013.01)
(58) Field of Classification Search
 CPC ........... H05K 7/20781; H05K 7/20136; H05K 7/20263; H05K 7/2039; H05K 7/20736
 See application file for complete search history.

(56) References Cited

U.S. PATENT DOCUMENTS

| | | | | |
|---|---|---|---|---|
| 5,329,425 A * | 7/1994 | Leyssens | ............ | F28D 15/0233 174/15.2 |
| 5,681,219 A * | 10/1997 | LeFevre | ............... | H05K 7/2059 454/187 |
| 6,222,730 B1 * | 4/2001 | Korvenheimo | ........ | H05K 7/206 361/696 |
| 6,474,329 B1 * | 11/2002 | Sears | ...................... | F24H 3/105 126/110 A |
| 6,816,372 B2 * | 11/2004 | Huettner | ................. | G06F 1/181 361/679.02 |
| 7,534,167 B2 * | 5/2009 | Day | ................... | H05K 7/20745 454/187 |
| 7,630,198 B2 * | 12/2009 | Doll | ...................... | F04D 17/164 361/679.49 |

(Continued)

OTHER PUBLICATIONS

Extended European Search Report with regard to the EP Patent Application No. 21306166.6 completed on Feb. 3, 2022.

*Primary Examiner* — Raheena R Malik
(74) *Attorney, Agent, or Firm* — BCF LLP

(57) ABSTRACT

A cooling assembly for a data center rack includes: a chassis; a heat exchanger connected to the chassis, the heat exchanger being disposed vertically at least in part between upper and lower ends of the chassis, and at least one lower bracket connected to a lower end portion of the chassis. The heat exchanger includes: a cooling coil for circulating a cooling fluid therethrough; and a plurality of fins connected to the cooling coil, the fins being spaced from one another to allow air flow therebetween. Each of the at least one lower bracket is a single piece of sheet metal bent into shape and includes a supporting wall extending frontward from the lower end portion of the chassis, the supporting wall being configured to receive at least in part a lower end of the data center rack thereon.

20 Claims, 14 Drawing Sheets

(56) References Cited

U.S. PATENT DOCUMENTS

| | | | | |
|---|---|---|---|---|
| 8,857,204 B2* | 10/2014 | Reytblat | ............ | H05K 7/20836 |
| | | | | 62/310 |
| 8,947,879 B2* | 2/2015 | Broome | ................... | H05K 7/20 |
| | | | | 361/679.48 |
| 9,253,929 B2* | 2/2016 | Tong-Viet | .......... | H05K 7/20727 |
| 9,392,733 B2* | 7/2016 | Day | ................... | H05K 7/20745 |
| 10,070,560 B2* | 9/2018 | Campbell | .......... | H05K 7/20809 |
| 10,451,295 B2* | 10/2019 | James | ..................... | F24F 13/14 |
| 11,602,074 B2* | 3/2023 | Keisling | ............ | H05K 7/20736 |
| 2008/0068791 A1* | 3/2008 | Ebermann | .......... | H05K 7/20754 |
| | | | | 361/679.54 |
| 2011/0105010 A1* | 5/2011 | Day | ................... | H05K 7/20745 |
| | | | | 454/184 |
| 2012/0155027 A1 | 6/2012 | Broome et al. | | |
| 2013/0115869 A1* | 5/2013 | Alshinnawi | ........ | H05K 7/20736 |
| | | | | 454/284 |
| 2014/0071617 A1 | 3/2014 | Tong-Viet | | |
| 2014/0317902 A1 | 10/2014 | Helbig et al. | | |
| 2017/0127576 A1 | 5/2017 | Campbell et al. | | |
| 2019/0069433 A1* | 2/2019 | Balle | ..................... | B25J 15/0014 |
| 2020/0163256 A1* | 5/2020 | Chehade | .............. | H05K 7/1488 |
| 2023/0067321 A1* | 3/2023 | Gao | ................... | H05K 7/20272 |
| 2023/0067935 A1* | 3/2023 | Bauchart | ............. | H05K 7/2039 |

* cited by examiner

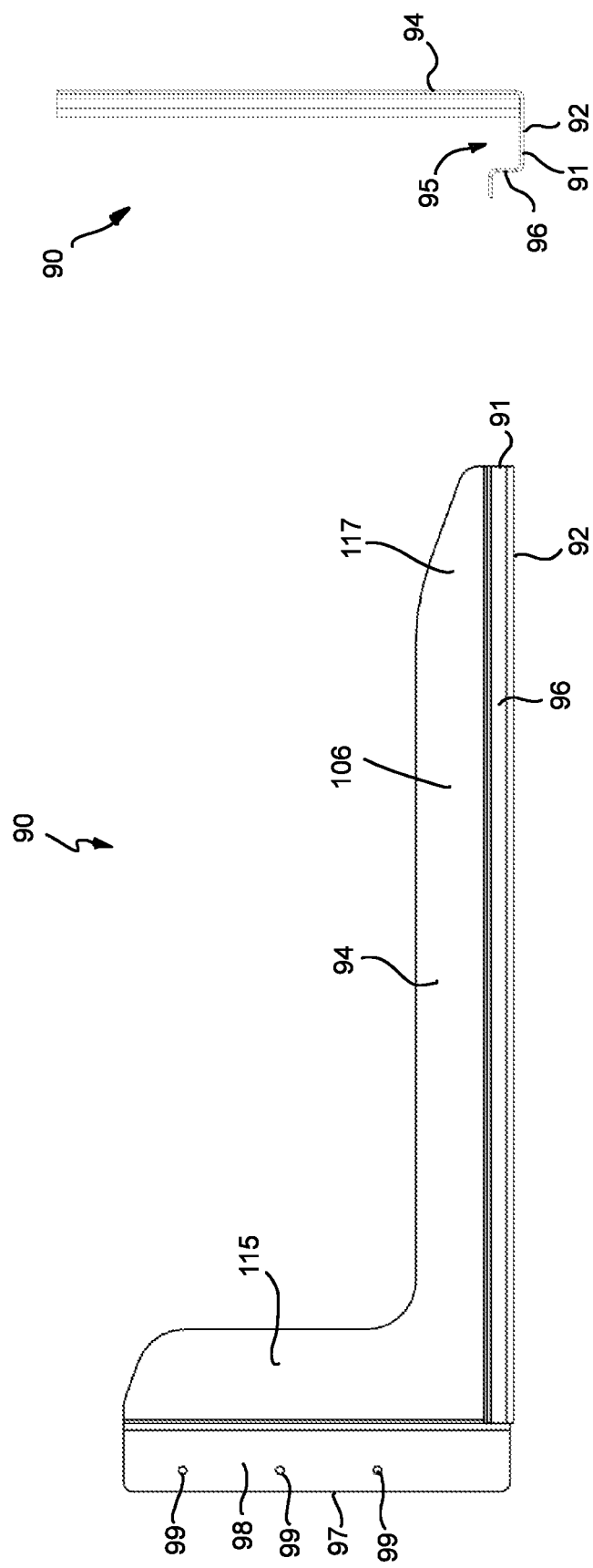

COOLING ASSEMBLY FOR A DATA CENTER RACK AND METHOD FOR ASSEMBLING A RACK SYSTEM

REFERENCE TO RELATED APPLICATION

The present application claims priority to European Patent Application No. EP21306166.6, which was filed Aug. 30, 2021, the entirety of which is incorporated by reference herein.

FIELD OF TECHNOLOGY

The present technology relates to cooling assemblies for data center racks.

BACKGROUND

Heat management is an important consideration when planning the implementation of a data center. Notably, the electronic equipment (e.g., servers, networking equipment, power equipment, etc.) stored within racks in the data center generates a significant amount of heat that must be evacuated to maintain efficient and functional operation of the data center.

Different types of heat management solutions are available to address this issue including, for example, computer room air handlers (CRAH) and in-row air handlers. In some cases, a rear cooling assembly can be provided on a rack to cool the air that is discharged by the rack into an adjacent aisle. However, the rack may have to be especially designed to fit the rear cooling assembly. Moreover, many such rear cooling assemblies can be difficult to install on a rack or may take up too much space behind the rack.

There is therefore a desire for a cooling assembly for a data center rack which can alleviate at least some of these drawbacks.

SUMMARY

It is an object of the present technology to ameliorate at least some of the inconveniences present in the prior art.

According to one aspect of the present technology, there is provided a cooling assembly for a data center rack. The cooling assembly comprises: a chassis having an upper end and a lower end spaced apart from one another in a vertical direction; at least one heat exchanger connected to the chassis, the at least one heat exchanger being disposed vertically at least in part between the upper and lower ends of the chassis, each of the at least one heat exchanger comprising: a cooling coil for circulating a cooling fluid therethrough; and a plurality of fins connected to the cooling coil, the fins being spaced from one another to allow air flow therebetween; and at least one lower bracket connected to a lower end portion of the chassis, each of the at least one lower bracket comprising a supporting wall extending frontward from the lower end portion of the chassis, the supporting wall being configured to receive at least in part a lower end of the data center rack thereon such that, in use, the supporting wall is disposed between the lower end of the data center rack and a support surface.

In some embodiments, each of the at least one lower bracket further comprises a guiding wall extending generally perpendicular to the supporting wall, the guiding wall being configured to guide a lateral position of the data center rack relative to the cooling assembly.

In some embodiments, each of the at least one lower bracket further comprises a connection flange extending rearwardly from the guiding wall and defining a rear end of the lower bracket, the connection flange being configured to be connected to the chassis.

In some embodiments, the at least one lower bracket comprises a left lower bracket and a right lower bracket laterally spaced apart from one another.

In some embodiments, the guiding wall of each of the left and right lower brackets comprises an inner lateral surface; the inner lateral surfaces of the guiding walls of the left and right lower brackets face one another; and a distance between the inner lateral surface of the guiding wall of the left lower bracket and the inner lateral surface of the guiding wall of the right lower bracket is configured to be greater than a rack width of the data center rack.

In some embodiments, the at least one lower bracket is configured to be slid under the lower end of the data center rack.

In some embodiments, the supporting wall of the at least one lower bracket has a thickness of no more than 5 mm.

In some embodiments, in use, the upper end of the chassis is configured to be disposed vertically higher than an upper end of the data center rack.

In some embodiments, the cooling assembly further comprises: an upper abutting assembly connected to the chassis near the upper end thereof, the upper abutting assembly being configured to abut the data center rack at an upper end of the data center rack to limit air flow at an interface between the upper abutting assembly and the upper end of the data center rack, a position of the upper abutting assembly being adjustable to adapt the cooling assembly to the data center rack.

In some embodiments, the upper abutting assembly comprises adjusting means for adjusting an angular orientation of the upper abutting assembly to selectively form a seal at the interface between the upper abutting assembly and the upper end of the data center rack.

In some embodiments, the cooling assembly further comprises at least one fan connected to a corresponding one of the at least one heat exchanger, the at least one fan being configured to promote air flow through the corresponding one of the at least one heat exchanger.

In some embodiments, the at least one lower bracket is configured to be fastened to the support surface.

According to another aspect of the present technology, there is provided a rack system for a data center, the rack system comprising a data center rack having an upper rack end and a lower rack end, the data center rack comprising a rack frame and defining at least one housing section configured to house electronic equipment therein; and the cooling assembly, at least part of the lower end of the data center rack being disposed atop the supporting wall of the at least one lower bracket.

In some embodiments, the data center rack has a depth measured between a front end and a rear end of the data center rack; and the at least one lower bracket extends in a front-to-rear direction along at least a majority of the depth of the data center rack In some embodiments, a weight of the data center rack supported by the at least one lower bracket keeps the cooling assembly upright.

According to yet another aspect of the present technology, there is provided a method for assembling a rack system comprises: positioning the cooling assembly on a support surface on a rear side of a data center rack; and moving the cooling assembly relative to the data center rack to slide the supporting wall of the at least one lower bracket of the cooling assembly underneath a lower end of the data center rack to affix the cooling assembly to the data center rack.

In some embodiments, the method further comprises affixing the supporting wall of the at least one lower bracket to the support surface.

In some embodiments, the method further comprises adjusting a position of an upper abutting assembly of the cooling assembly to abut an upper end of the data center rack to limit air flow at an interface between the upper abutting assembly and the data center rack.

According to yet another aspect of the present technology, there is provided cooling assembly for a data center rack, comprising: a chassis having an upper end and a lower end spaced apart from one another in a vertical direction, the chassis having a front end configured to abut a rear end of the data center rack; at least one heat exchanger connected to the chassis, the at least one heat exchanger being disposed vertically at least in part between the upper and lower ends of the chassis, each of the at least one heat exchanger comprising: a cooling coil for circulating a cooling fluid therethrough; and a plurality of fins connected to the cooling coil, the fins being spaced from one another to allow air flow therebetween; an upper abutting assembly connected to the chassis, the upper abutting assembly being configured to abut the data center rack at an upper end of the data center rack to limit air flow at an interface between the upper abutting assembly and the upper end of the data center rack, a position of the upper abutting assembly being adjustable to adapt the cooling assembly to the data center rack.

In some embodiments, the upper abutting assembly comprises adjusting means for adjusting an angular orientation of the upper abutting assembly to selectively form a seal at the interface between the upper abutting assembly and the upper end of the data center rack.

In some embodiments, the adjusting means is operable to flex the upper abutting assembly to adjust the angular orientation of the upper abutting assembly.

In some embodiments, the upper abutting assembly comprises a generally L-shaped bracket.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 12 is a right side elevation view of the left lower bracket of FIG. 10;

FIG. 13 is a front elevation view of the left lower bracket of FIG. 10; and

DETAILED DESCRIPTION

Figure 1:
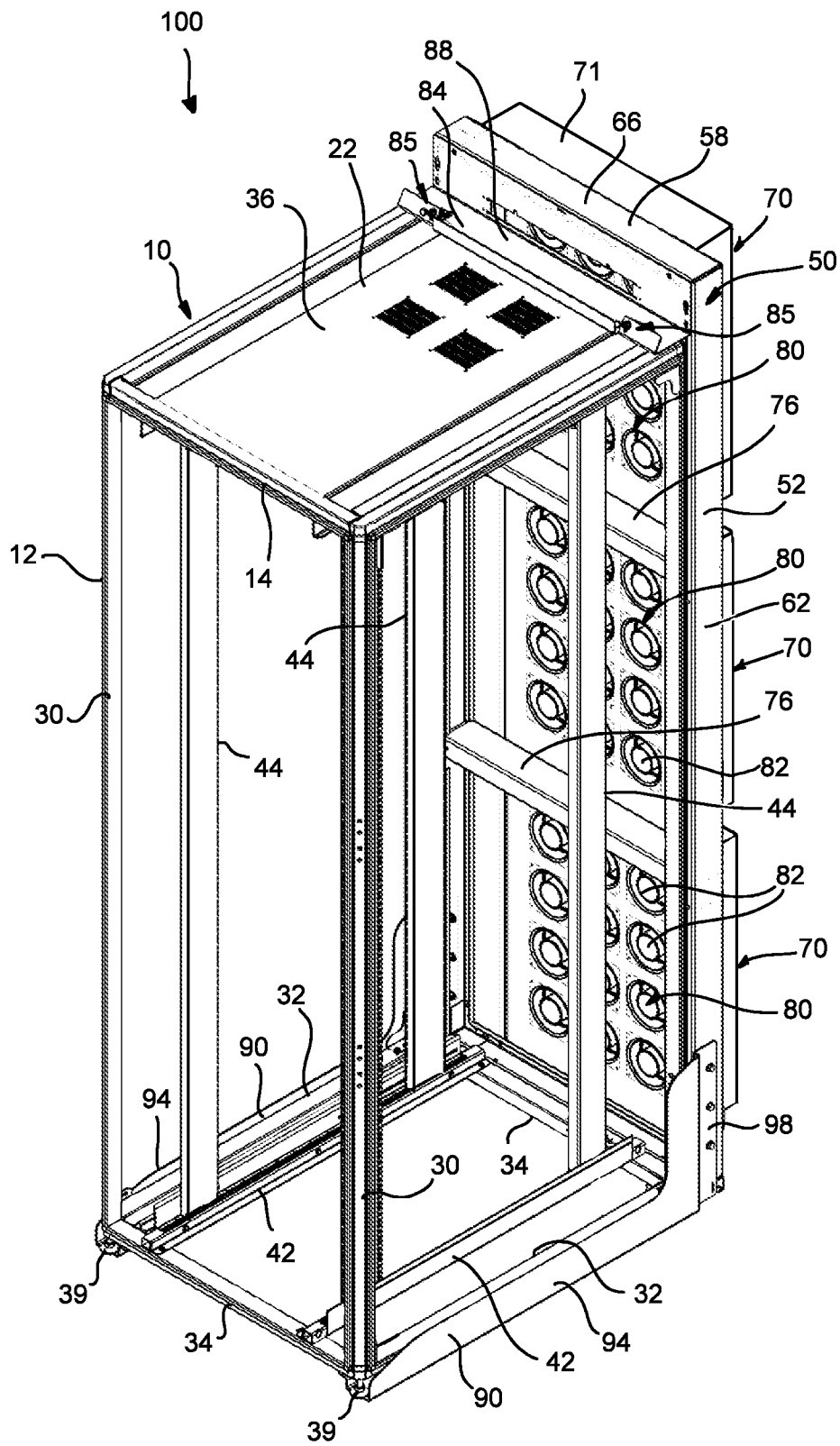
FIG. 1 is a perspective view, taken from a top, front, left side, of a rack system according to an embodiment of the present technology.
Figure 2:
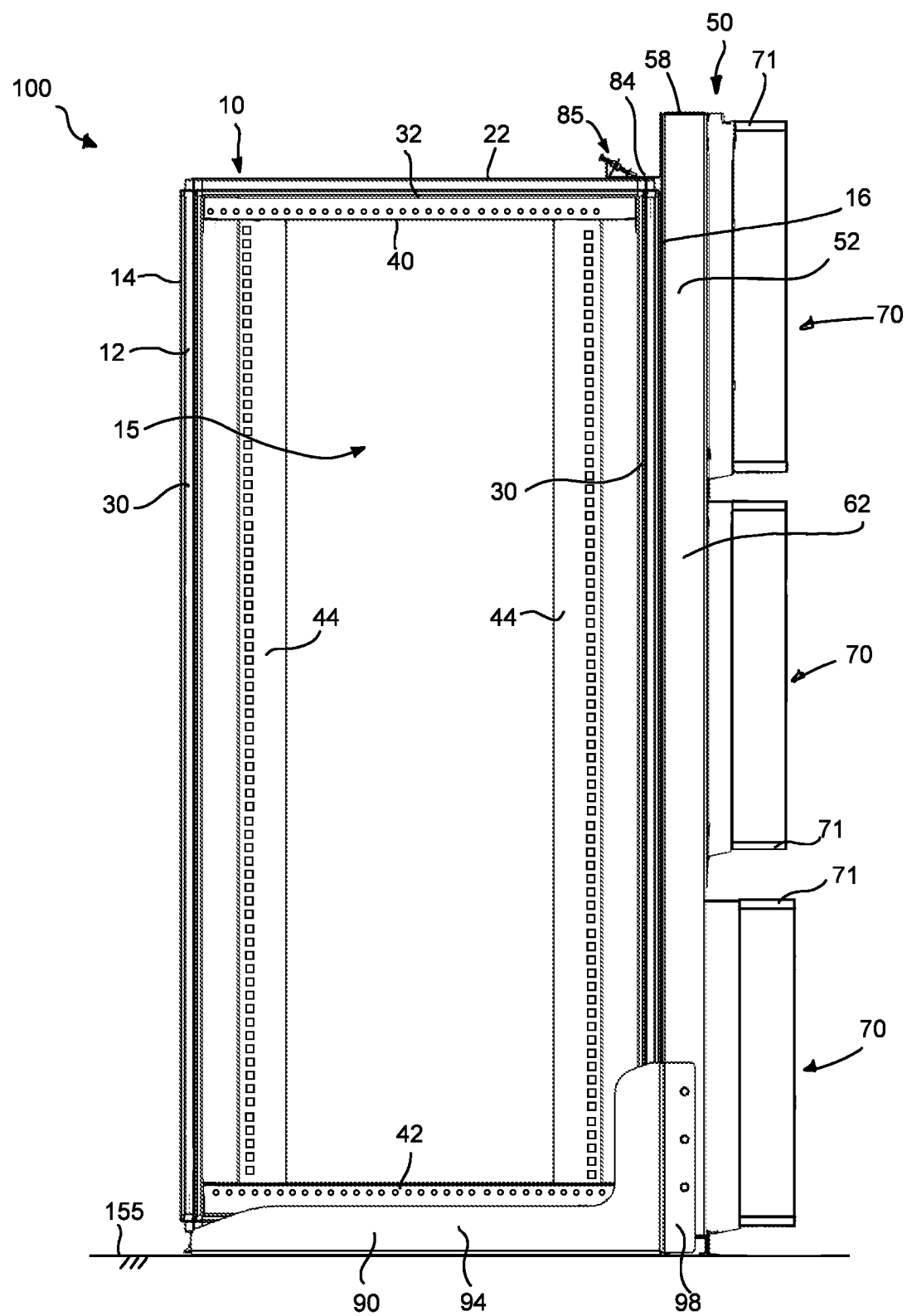
FIG. 2 is a left side elevation view of the rack system of FIG. 1.
Figure 3:
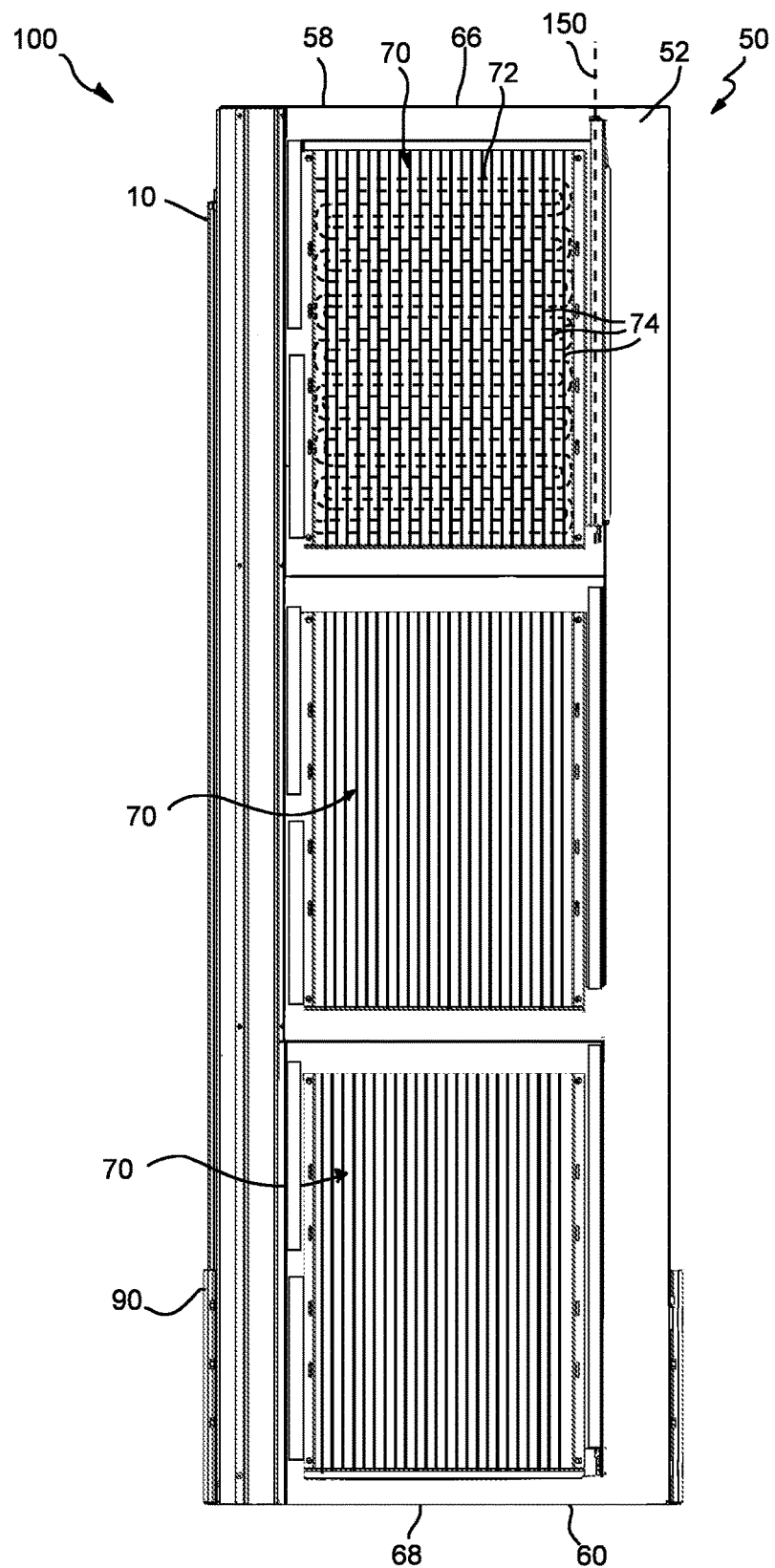
FIG. 3 is a rear elevation view of the rack system of FIG. 1.

FIGS. 1 to 3 illustrate a rack system 100 in accordance with an embodiment of the present technology. The rack system 100 is configured for use in a data center which, in use, houses multiple ones of the rack system 100. Notably, the rack system 100 is configured to house electronic equipment such as servers, networking equipment, power equipment or any other suitable electronic equipment that is designed to support the function of the data center. In use, multiple such rack systems 100 are aligned in rows spaced from one another (forming aisles therebetween) and extending parallel to one another. The rack system 100 includes a rack 10 (which may be referred to as a "data center rack") configured to house and support the electronic equipment, and a cooling assembly 50 for cooling air flowing through the rack 10. As will be described in greater detail below, the cooling assembly 50 is adapted to be easily installed on the rack 10 by disposing part of the cooling assembly 50 below a lower end 24 of the rack 10.

Figure 7A:
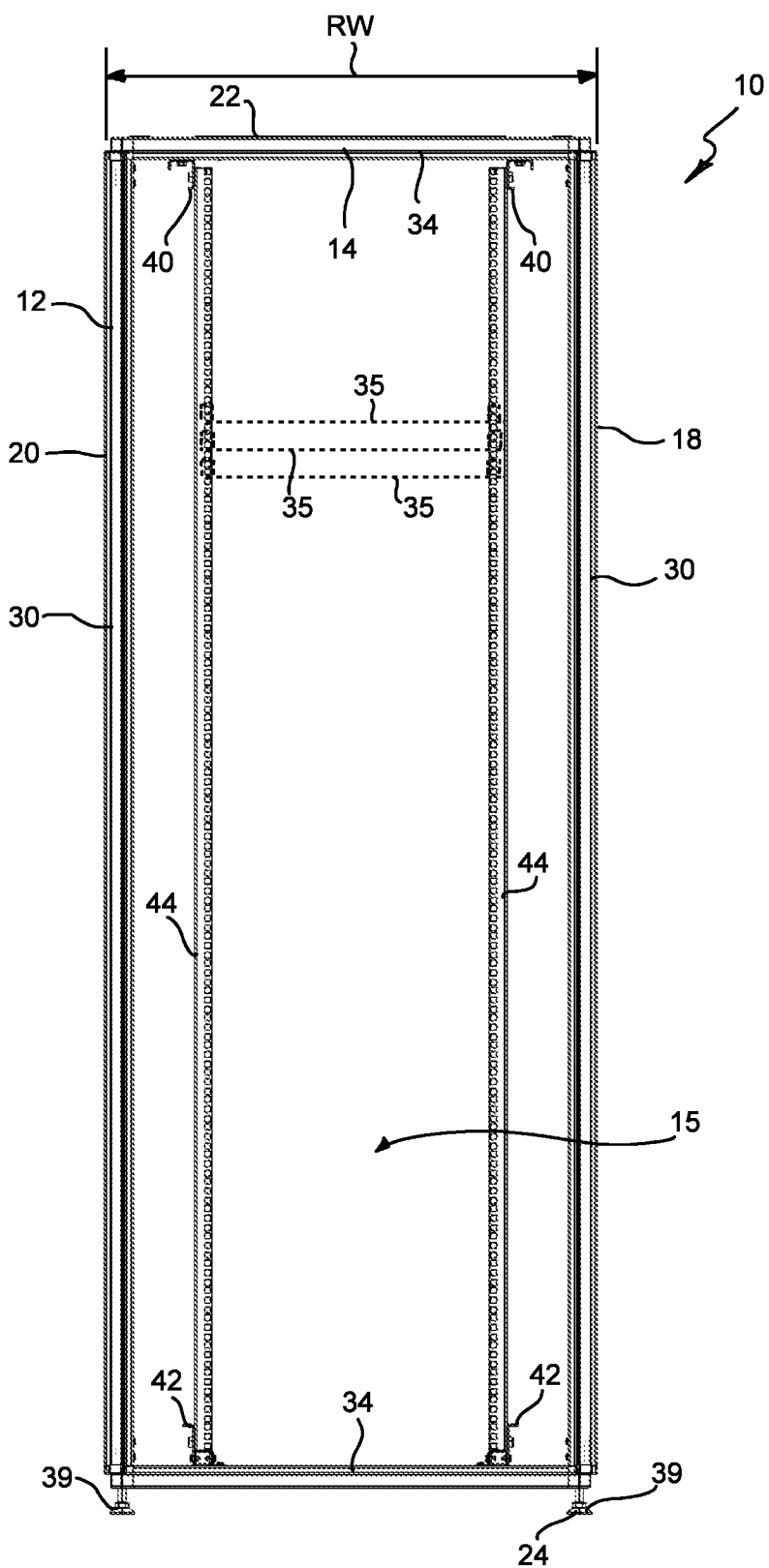
FIG. 7A is a front elevation view of a rack of the rack system of FIG. 1.

As shown in FIGS. 1, 2 and 7A, the rack 10 has a front end 14, a rear end 16, left and right ends 18, 20, and upper and lower ends 22, 24. The rack 10 has a rack frame 12 for supporting the various components of the rack 10. In this embodiment, the rack frame 12 has four vertical frame members 30 and a plurality of horizontal frame members 32, 34 extending between and interconnecting the vertical frame members 30. The vertical frame members 30 form respective corners of the rack frame 12. In this embodiment, the vertical frame members 30 and the horizontal frame members 32, 34 are elongated. The horizontal frame members 32 extend longitudinally (i.e., in the front-to-rear direction) while the horizontal frame members 34 extend laterally. The rack frame 12 may be configured differently in other embodiments. For instance, the rack frame 12 may have additional components and/or may have different components. Moreover, in some embodiments, a width of the rack frame 12 may be greater than a height of the rack frame 12.

As shown in FIGS. 1 and 7A, in this embodiment, the rack 10 has four feet 39 for supporting the rack 10 on a support surface 155 (for example a ground surface of the data center). In particular, the four feet 39 are connected to a lower portion of the rack frame 12, namely to the ends of the horizontal frame members 34, and extend downwardly therefrom. As such, in this embodiment, the feet 39 define the lower end 24 of the rack 10. It is contemplated that the feet 39 may be omitted in other embodiments. For instance, in such embodiments, the rack frame 12 may define the lower end 24 of the rack 10.

In this embodiment, the rack 10 has left and right upper rails 40 and left and right lower rails 42 connected to the horizontal frame members 34. The upper and lower rails 40, 42 are elongated and extend longitudinally such that each of the upper and lower rails 40, 42 interconnects two of the horizontal frame members 34. The rack 10 also has four vertical support members 44 that are connected to the upper and lower rails 40, 42. More specifically, two left ones of the vertical support members 44 are connected to the left upper rail 40 and to the left lower rail 42, while two right ones of the vertical support members 44 are connected to the right upper rail 40 and to the right lower rail 42. In this embodiment, the vertical support members 44 are adjustably connected along the lengths of the upper and lower rails 40, 42. The vertical support members 44 define a plurality of openings 45 vertically spaced from one another for connecting a plurality of support shelves 35, a few of which are illustrated in dashed lines in FIG. 7A. The support shelves 35 are configured to support the electronic equipment (e.g., servers, networking equipment and/or power equipment) which the rack 10 is designed to house therein. As such, the rack 10 defines a housing section 15 (FIGS. 2, 7A) between the vertical support members 44 for housing the electronic equipment during use of the rack 10.

Figure 7B:
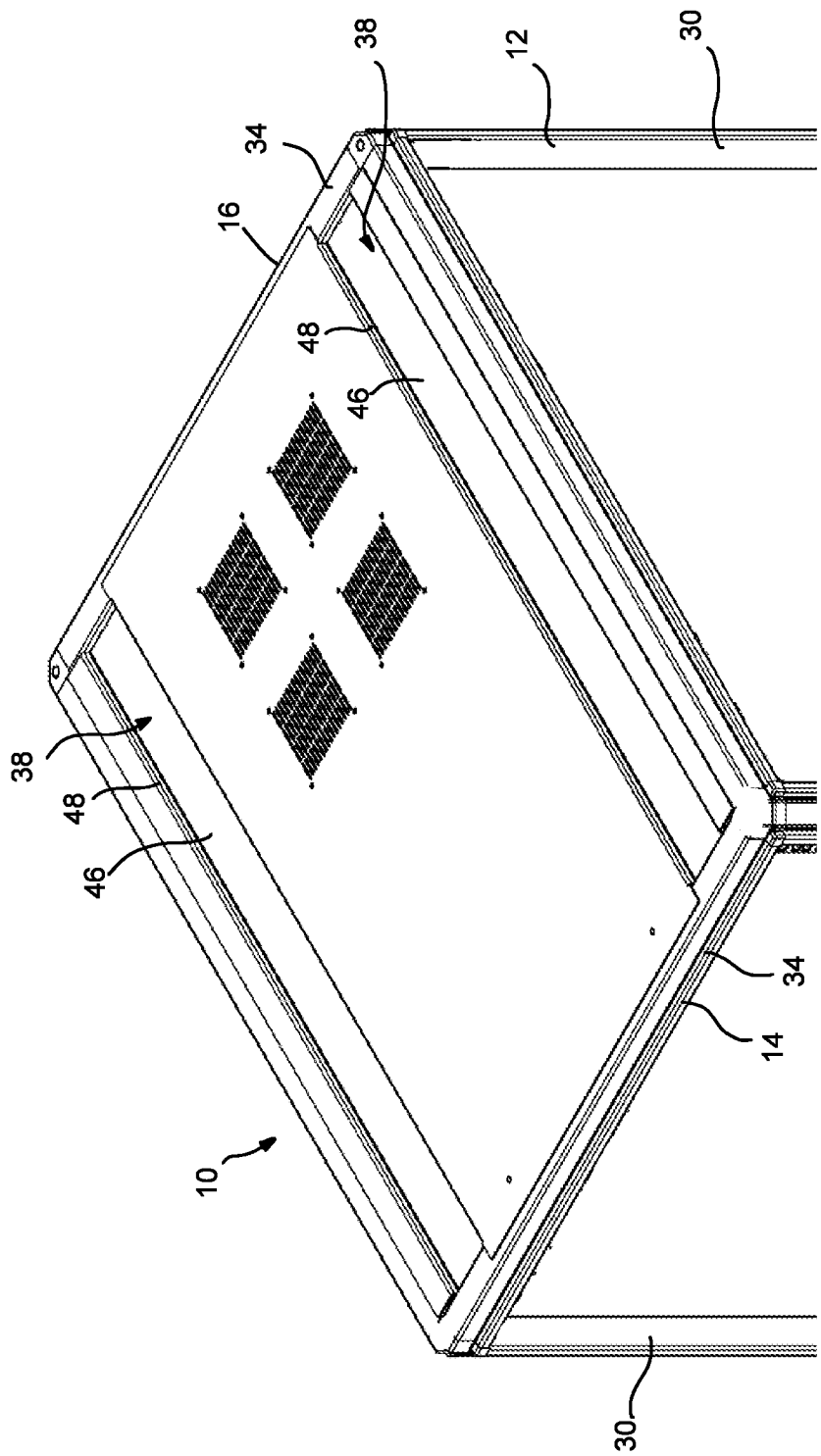
FIG. 7B is a perspective view, taken from a top, front, left side, of part of the rack of FIG. 7A.

As shown in FIGS. 1 and 7B, the rack 10 also has an upper panel 36 defining at least in part the upper end 22 of the rack 10. In this embodiment, the upper panel 36 has a generally rectangular shape and defines two longitudinal channels 38. Notably, as shown in FIG. 7B, each channel 36 is defined between a bottom channel wall 46 extending horizontally and two side walls 48 extending upwardly from the bottom channel wall 46. A rear end of each channel 36 terminates at the front end of a top, front one of the horizontal frame members 44. The channels 38 may be omitted in other embodiments. The rack 10 also has lateral enclosing panels (not shown) to enclose the internal volume of the rack 10.

Figure 8:
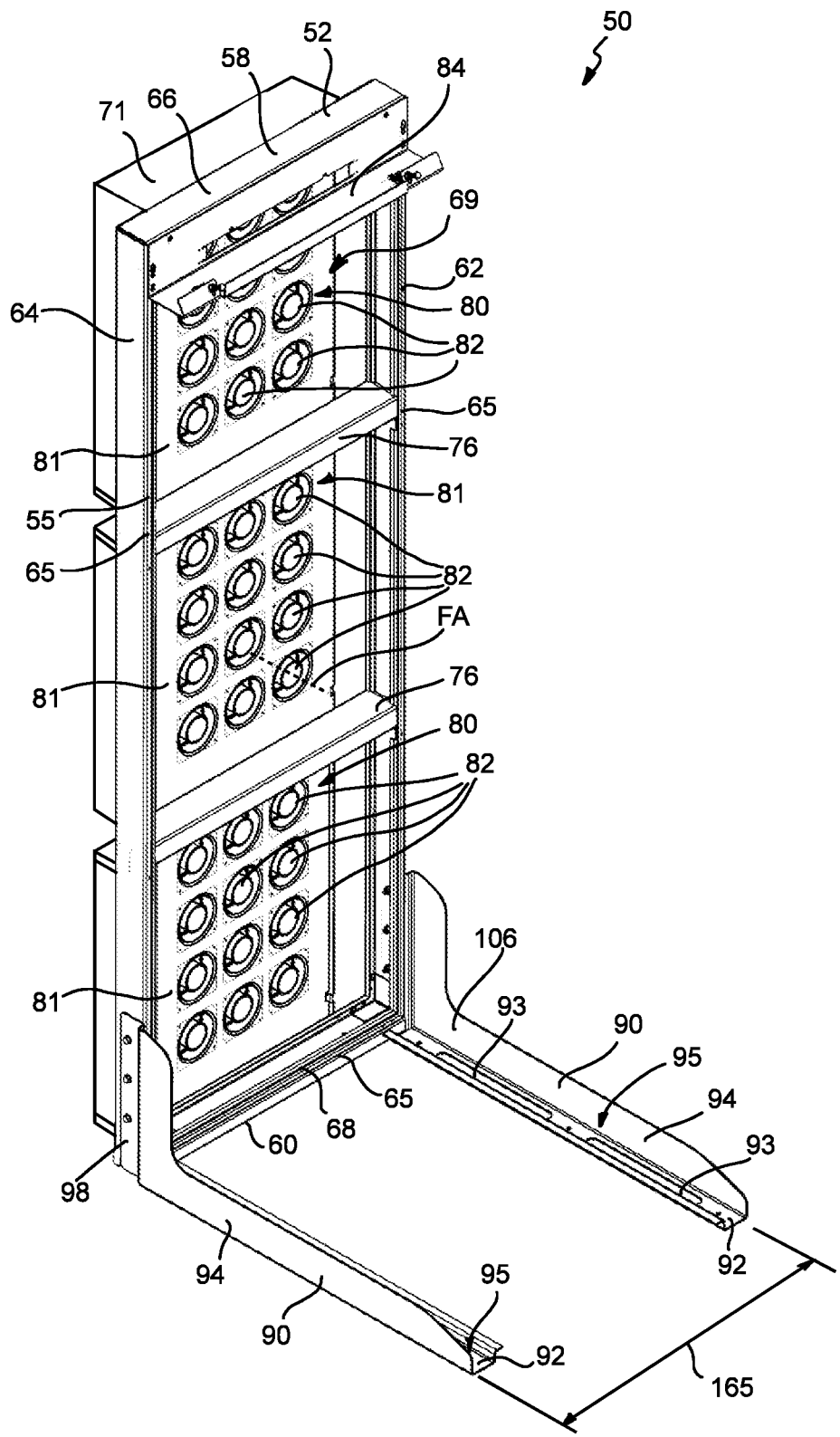
FIG. 8 is a perspective view, taken from a top, front, right side, of a cooling assembly of the rack system of FIG. 1.

With reference to FIGS. 1 and 2, in use, the cooling assembly 50 is disposed on a rear side of the rack 10 and is abutted against the rear end 16 thereof. The cooling assembly 50 has a chassis 52 for supporting the various components of the cooling assembly 50. As shown in FIG. 8, in this embodiment, the chassis 52 is generally rectangular and includes left and right vertical chassis portions 62, 64, and upper and lower horizontal chassis portions 66, 68. The upper and lower horizontal chassis portions 66, 68 extend laterally between the vertical chassis portions 62, 64. As can be seen, in this embodiment, the vertical chassis portions 62, 64 and the horizontal chassis portions 66, 68 are elongated. The upper and lower chassis portions 66, 68 define upper and lower ends 58, 60 of the chassis 52 and are spaced apart from one another in the vertical direction.

As best shown in FIG. 8, the left and right vertical chassis portions 62, 64 and the upper and lower horizontal chassis portions 66, 68 define a cooling chassis opening 69 therebetween through which, in use, air flows to respective heat exchangers 70 of the cooling assembly 50 which will be described in greater detail below. In this embodiment, the chassis 52 also has two horizontal bracing members 76 interconnecting the left and right vertical chassis portions 62, 64. The bracing members 76 extend parallel to the upper and lower horizontal chassis portions 66, 68 and are disposed between the upper and lower ends 58, 60 of the chassis 52 such that the bracing members 76 extend within the cooling chassis opening 69. The chassis 52 may be configured differently in other embodiments.

As shown in FIGS. 2 and 3, the cooling assembly 50 has three heat exchangers 70 which provide the cooling function of the cooling assembly 50. The heat exchangers 70 are air-to-liquid heat exchangers adapted to transfer heat from air flowing therethrough to liquid circulating therein. Each heat exchanger 70 has an exchanger frame 71, a cooling coil 72 (shown for one of the heat exchangers 70 in FIG. 3) supported by the exchanger frame 71 and configured for circulating a cooling fluid therein, and a plurality of fins 74 connected to the cooling coil 72.

The fins 74 are spaced apart from one another to allow air flow therebetween. The cooling coil 72 has an inlet for allowing the cooling fluid therein and an outlet for discharging the cooling fluid therefrom. In use, the cooling coils 72 of the heat exchangers 70 are fluidly connected to an external cooling fluid source (e.g., a dry cooler) that provides cooled cooling fluid to the heat exchangers 70 and receives heated cooling fluid therefrom.

In this embodiment, the cooling coils 72 of the heat exchangers 70 are fluidly connected in series. Notably, the outlets of the cooling coils 72 of two of the heat exchangers 70 are fluidly connected to the inlet of two of the other heat exchangers 70, and the outlet of another cooling coil 72 of one of the heat exchangers 70 is fluidly connected to the external cooling fluid source. It is contemplated that, in other embodiments, the cooling coils 72 may be connected to the external cooling fluid source in parallel.

In this embodiment, the cooling fluid that is fed through the cooling coils 72 of the heat exchangers 70 is a cooling liquid, and more specifically water. The cooling fluid could be any other suitable type of cooling fluid (e.g., a refrigerant, a two-phase fluid, or others).

As can be seen, in this embodiment, the heat exchangers 70 are disposed above one another in the vertical direction, with each heat exchanger 70 being disposed vertically at least in part between the upper and lower ends 58, 60 of the chassis 52. The heat exchangers 70 therefore vertically overlap the cooling chassis opening 69 defined by the chassis 52 such that, in use, air flowing through the cooling chassis opening 69 flows through the heat exchangers 70. Furthermore, in this embodiment, the heat exchanger frame 71 of each heat exchanger 70 is hingedly connected to the chassis 52 such that the heat exchanger 70 is pivotable about a respective vertical axis 150 (one of which is illustrated in FIG. 3).

It is contemplated that more or fewer heat exchangers 70 may be provided in other embodiments. For instance, in some embodiments, a single heat exchanger 70 may be provided and may be sized to span a majority of the height of the rack 10. Moreover, the heat exchangers 70 may be configured differently in other embodiments.

As best shown in FIG. 8, in this embodiment, the cooling assembly 50 also includes three fan sub-assemblies 80 for promoting air flow through the heat exchangers 70. Notably, each fan sub-assembly 80 is associated with a respective one of the heat exchangers 70 and is disposed in front of that heat exchanger 70. Each fan sub-assembly 80 includes a fan mount frame 81 and a plurality of fans 82 connected to the fan mount frame 81. Each fan mount frame 81 is connected to the exchanger frame 71 of the corresponding heat exchanger 70. As such, each fan sub-assembly 80 is pivotable together with the corresponding heat exchanger 70 about the axis 150. In use, as illustrated for one of the fans 82 in FIG. 8, the fans 82 are rotatable about respective fan axes FA. As can be seen, in this embodiment, the fan axis FA of each fan 82 extends generally horizontally in the front-to-rear direction. More or fewer fans 82 may be provided in other embodiments.

It is contemplated that, in other embodiments, the fans 82 may be separate from the cooling assembly 50. For instance, instead of the fan sub-assemblies 80, fans may be disposed within the rack 10.

Thus, in use, when the cooling assembly 50 is connected to the rack 10 to form the rack assembly 100, air flows through the rack 10 (as promoted by the fans 82) where it absorbs heat from the electronic equipment housed therein. The heated air then flows through the heat exchangers 70 of the cooling assembly 50 where heat is transferred from the air to the cooling fluid circulated through the cooling coils 72. The cooled air is then discharged through the rear side of the cooling assembly 50 and into the aisle formed between consecutive rows of the rack assemblies 100. The cooling assembly 50 thus allows lowering the temperature of air within the aisles formed between consecutive rows of the rack systems 100.

Figure 5A:
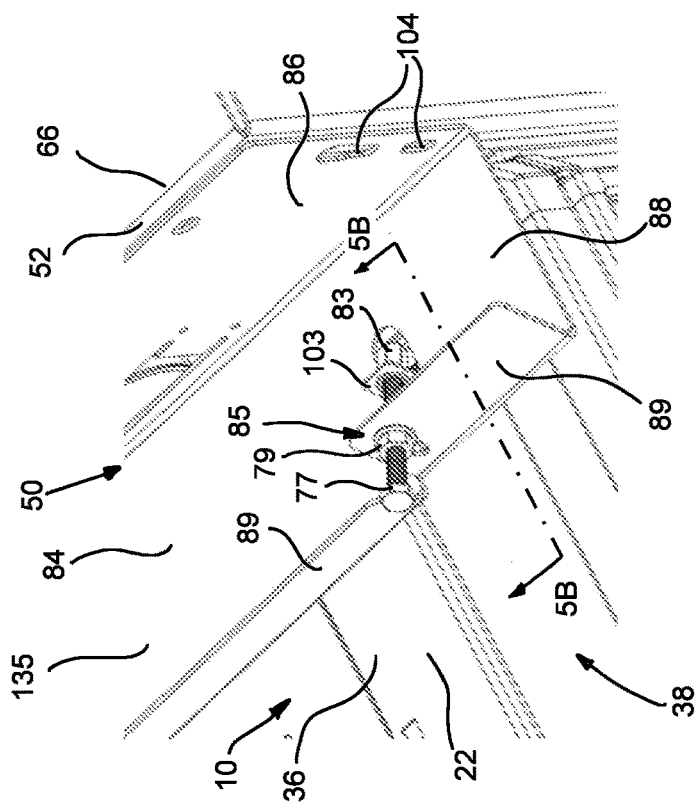
FIG. 5A is a detailed view of part of FIG. 4.
Figure 4:
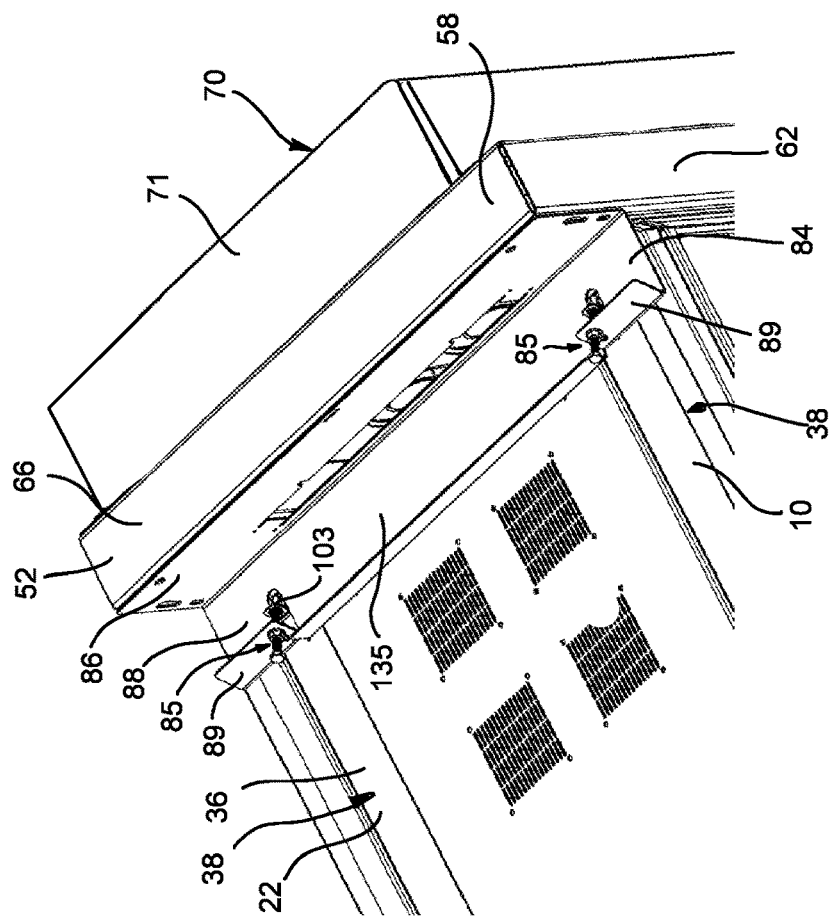
FIG. 4 is a perspective view, taken from a top, front, left side, of part of the rack system of FIG. 1.
Figure 5B:
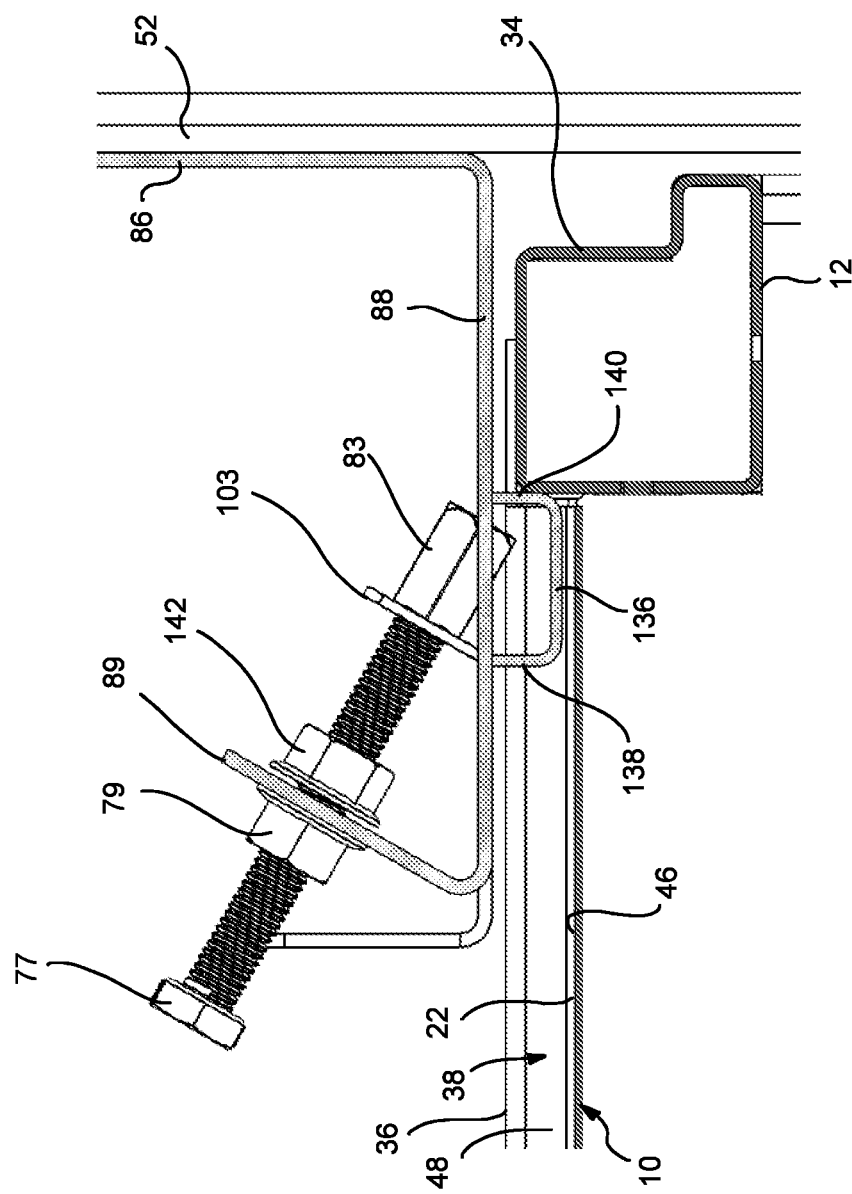
FIG. 5B is a cross-sectional view taken along line 5B-5B in FIG. 5A.
Figure 9:
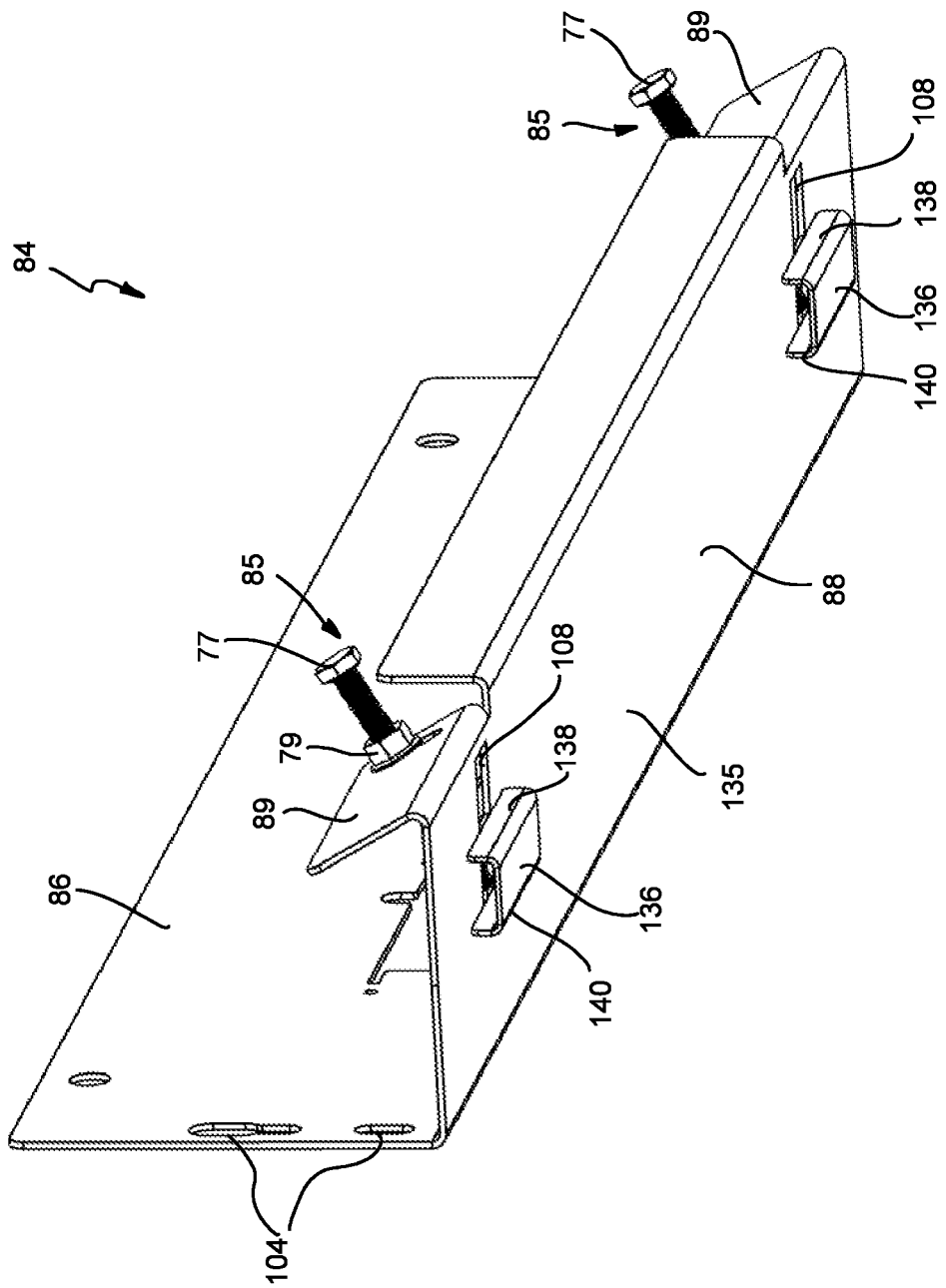
FIG. 9 is a perspective view, taken from a bottom, front, right side, of an upper abutting assembly of the cooling assembly of FIG. 8.

With reference to FIGS. 4 to 5B and 8, in this embodiment, the cooling assembly 50 also has an upper abutting assembly 84 configured to abut the rack 10 at the upper end 22 thereof to form a seal and thus limit air flow between the chassis 52 and the rack 10. That is, the upper abutting assembly 84 minimizes or prevents air flow leaks at the upper end 22 of the rack 10. The upper abutting assembly 84 is connected to the chassis 52 and extends frontward therefrom. In this embodiment, the upper abutting assembly 84 includes a generally L-shaped bracket 135 having a fixed portion 86 connected to the chassis 52 and an abutting portion 88 extending from a lower end of the fixed portion 86 at an angle relative thereto. In this embodiment, the bracket 135 has two lips 89 extending upwardly from a front end of the abutting portion 88 at angle toward the fixed portion 86. The two lips 89 are laterally spaced from one another, namely being disposed at lateral ends of the bracket 135. With reference to FIGS. 5B and 9, in this embodiment, the upper abutting assembly 84 also has two channel-engaging brackets 136 which, in use, are received in the channels 38 of the upper panel 36 of the rack 10. The channel-engaging brackets 136 are connected to the bracket 135 (e.g., welded thereto) and extend downward from the abutting portion 88. In this embodiment, each channel-engaging bracket 136 has a generally U-shaped cross-sectional profile (along a plane normal to the abutting portion 88 and extending in the front-to-rear direction). Each channel-engaging bracket 136 has a front end 138 and a rear end 140. As shown in FIG. 5B, each channel-engaging bracket 136 also has a tab 103 extending upwardly from the front end 140 of the channel-engaging bracket 136. Notably, the tab 103 extends through a respective opening 108 defined by the abutting portion 88 of the bracket 135 and is angled rearwardly such that the tab 103 extends toward the fixed portion 86. In particular, in this embodiment, the tab 103 is disposed rearward from a corresponding one of the lips 89 and extends parallel thereto.

The position of the upper abutting assembly 84 is adjustable to fit the rack 10 thereunder. Notably, the fixed portion 86 can be connected to the chassis 52 along various vertical positions via slots 104 (FIG. 5A) defined by the fixed portion 86 which receive fasteners therein that fix the fixed portion 86 to the chassis 52. Furthermore, the angular orientation of at least part of the upper abutting assembly 84 is adjustable via adjusting means 85. More particularly, a flexion of the abutting portion 88 is adjusted by the adjusting means 85 to regulate a contact between the upper abutting assembly 84 and the upper end 22 of the rack 10. As such, in this embodiment, a "rough" adjustment of the position of the upper abutting assembly 84 is effected by the connection of the fixed portion 86 to the chassis 52 (i.e., varying the vertical position of the fixed portion 86 relative to the chassis 52 via the slots 104) while a "fine" adjustment of the position of the upper abutting assembly 84 is made via the adjusting means 85 as will be described below.

In this embodiment, as shown in FIGS. 5A and 5B, the adjusting means 85 is two adjusters 85, each including four threaded fasteners 77, 79, 83, 142 which interact with one another to allow a user to adjust the angular orientations of the abutting portion 88 and the channel-engaging brackets 136. The fastener 77 is a bolt which extends through one of the lips 89 and a respective one of the tabs 103. The fasteners 79, 83, 142 are internally threaded fasteners, namely nuts, which threadedly receive the bolt 77. The nut 79 is fixed to a respective one of the tabs 103 and is rotationally fixed to the end of the bolt 77 (e.g., via a threadlocking sealant). The fastener 77 is thus rotationally fixed to the tab 103.

The nuts 83, 142 are disposed on opposite sides of the lip 89 and are threadedly adjustable relative to the bolt 77 to actuate the respective adjuster 85. Notably, by rotating one of the nuts 83, 142 relative to the fastener 77 and against the lip 89, a distance between the lip 89 and the corresponding tab 103 is adjusted and, consequently, the angular orientation of the abutting portion 88 is modified. In particular, the flexion of the abutting portion 88 is modified by selectively rotating the nuts 83, 142 against the lip 89, such that the abutting portion 88 and the channel-engaging brackets 136 can be forced into greater contact with the upper end 22 of the rack 10 and thereby minimize air flow therebetween. More specifically, as shown in FIG. 5B, in use, each channel-engaging bracket 136 is first received in the corresponding channel 38 and is disposed near the front end of a top, rear one of the horizontal frame members 34 which defines in part the upper end 22 of the rack 10 (and the rear end of the channel 38). By tightening the nut 142 against the lip 89, thereby increasing the distance between the lip 89 and the tab 103, the flexion applied on the abutting portion 88 forces the abutting portion 88 and the channel-engaging bracket 136 downwards against the upper end 22 of the rack 10 and consequently forms a better seal to minimize air flow between the upper abutting assembly 84 and the upper end 22 of the rack 10. On the other hand, tightening the nut 79 against the lip 89, thereby shortening the distance between the lip 89 and the tab 103, the flexion applied on the abutting portion 88 tilts the front end of the abutting portion 88 upward and thus distances the abutting portion 88 and the channel-engaging bracket 136 away from the upper end 22 of the rack 10.

Thus, when the rack 10 is in place relative to the cooling assembly 50, a force applied by the upper abutting assembly 84 on the upper end 22 of the rack 10 can be varied by operating the adjusters 85. As such, a seal can be formed between the upper abutting assembly 84 and the upper end 22 of the rack 10 by forcing the upper abutting assembly 84 against the upper end 22 of the rack 10. In some embodiments, a lower side of the abutting portion 88 and the channel-engaging brackets 136 may have a sealing member (e.g., a foam joint) to further seal the interface between the upper abutting assembly 84 and the upper end 22 of the rack 10.

With reference now to FIGS. 1, 2 and 8, the cooling assembly 50 has left and right lower brackets 90 extending frontward from the lower end portion of the chassis 52 and configured to maintain the cooling assembly 50 in its upright orientation. Notably, as will be described in greater detail below, in this embodiment, the lower brackets 90 are engaged by the lower end 24 of the rack 10 in order to maintain the cooling assembly 50 in its upright orientation. The lower brackets 90 will now be described with reference to FIGS. 10 to 13 which illustrate the left lower bracket 90. In this embodiment, the left and right lower brackets 90 are a mirror image of one another about a vertical plane bisecting the width of the chassis 52. As such, only the left lower bracket 90 will be described in detail herein. It is to be understood that the same description applies to the right lower bracket 90.

Figure 10:
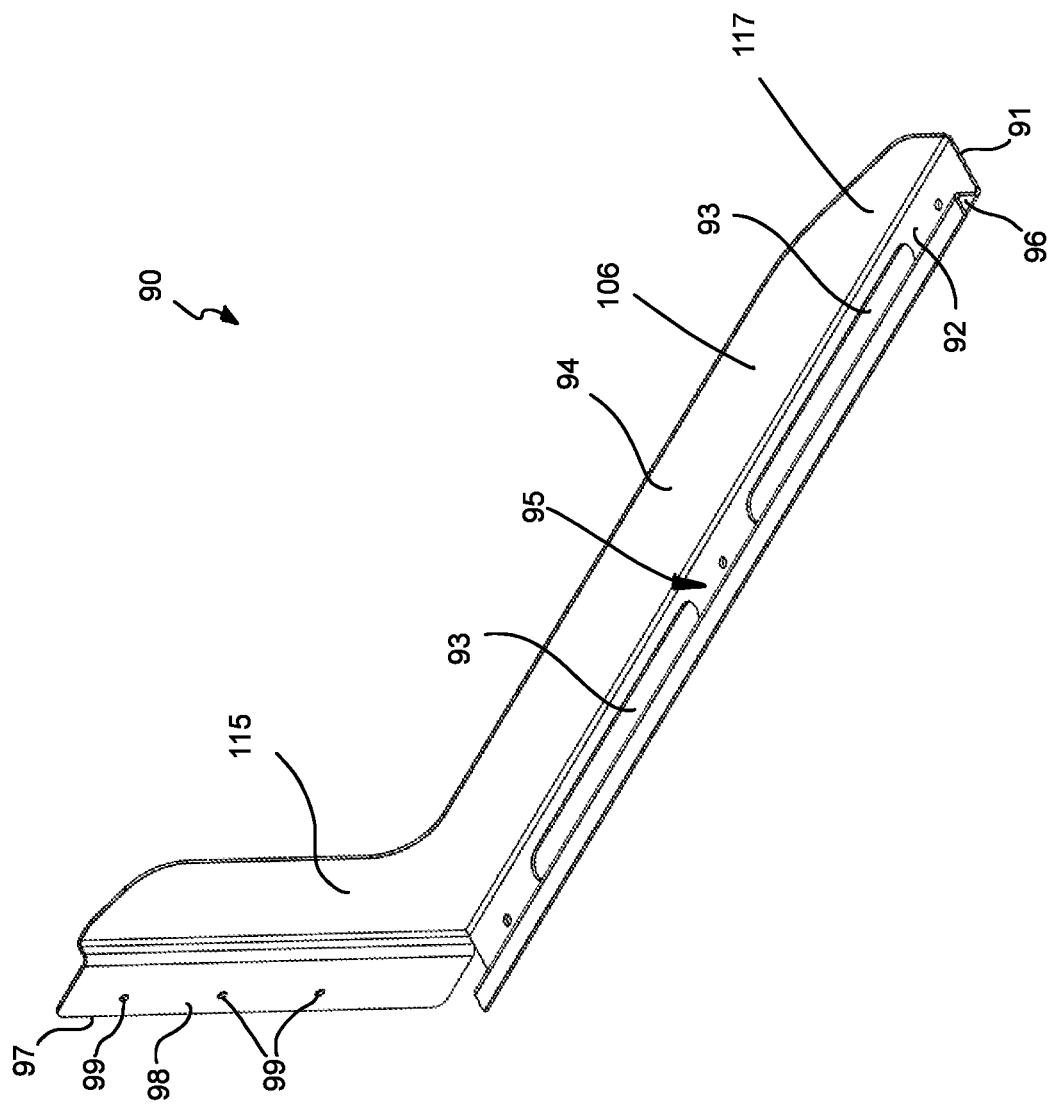
FIG. 10 is a perspective view, taken from a top, front, right side, of a left lower bracket of the cooling assembly of FIG. 8.
Figure 11:
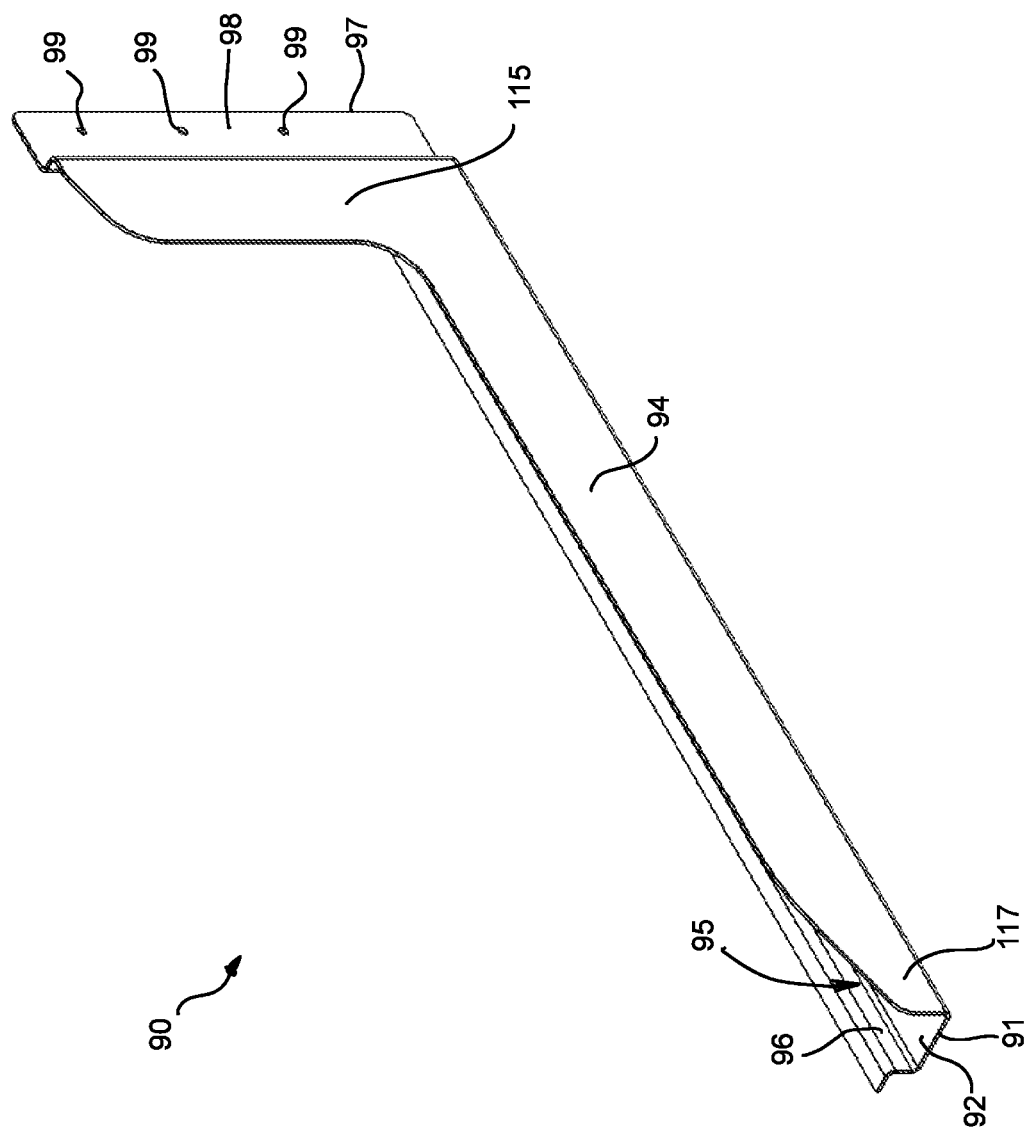
FIG. 11 is a perspective view, taken from a top, front, left side, of the left lower bracket of FIG. 10.

As shown in FIGS. 10 to 12, the lower bracket 90 extends from a front end 91 to a rear end 97 defining a length of the lower bracket 90 therebetween. In this embodiment, the lower bracket 90 includes a supporting wall 92 and an outer guiding wall 94 extending upwardly from the supporting wall 92. In particular, the outer guiding wall 94 extends generally perpendicular to the supporting wall 92. Notably, the outer guiding wall 94 extends vertically while the supporting wall 92 extends horizontally. In this embodiment, the outer guiding wall 94 is generally L-shaped such that a rear end portion 115 of the outer guiding wall 94 extends vertically higher than a front end portion 117 of the outer guiding wall 94. In use, as shown in FIG. 2, the supporting wall 92 receives the feet 39 of the rack 10 thereon such that the supporting wall 92 is disposed between the feet 39 and the support surface 155. In this embodiment, the supporting wall 92 defines two longitudinal slots 93 which can be optionally used for fastening the lower bracket 90 to the support surface 155.

The outer guiding wall 94 serves as a guide for the rack 10 such as to facilitate alignment of the rack 10 relative to the cooling assembly 50. Notably, referring to FIG. 8, in this embodiment, the left and right lower brackets 90 are connected to the chassis 52 such that inner lateral surfaces 106 of the outer guiding walls 94 thereof are spaced apart from one another by a distance 165 that is slightly greater than a rack width RW (FIG. 7A) of the rack 10. It is contemplated that, in other embodiments, the outer guiding wall 94 could be omitted or separate brackets could be provided to fulfill the function of the outer guiding wall 94.

In this embodiment, the lower bracket 90 also has an inner guiding wall 96 extending upwardly from the supporting wall 92. More particularly, the inner guiding wall 96 extends vertically and is thus parallel to the outer guiding wall 94. As best shown in FIGS. 10, 11 and 13, the supporting wall 92, the outer guiding wall 94 and the inner guiding wall 96 form a channel 95 therebetween for receiving the feet 39 of the rack 10 therein. In order not to interfere with the rack frame 12, the inner guiding wall 96 has a height that is less than a height of the outer guiding wall 94, and in particular less than a distance between the support surface 155 and the rack frame 12. It is contemplated that, in other embodiments, the inner guiding wall 96 could be omitted.

Figure 6:
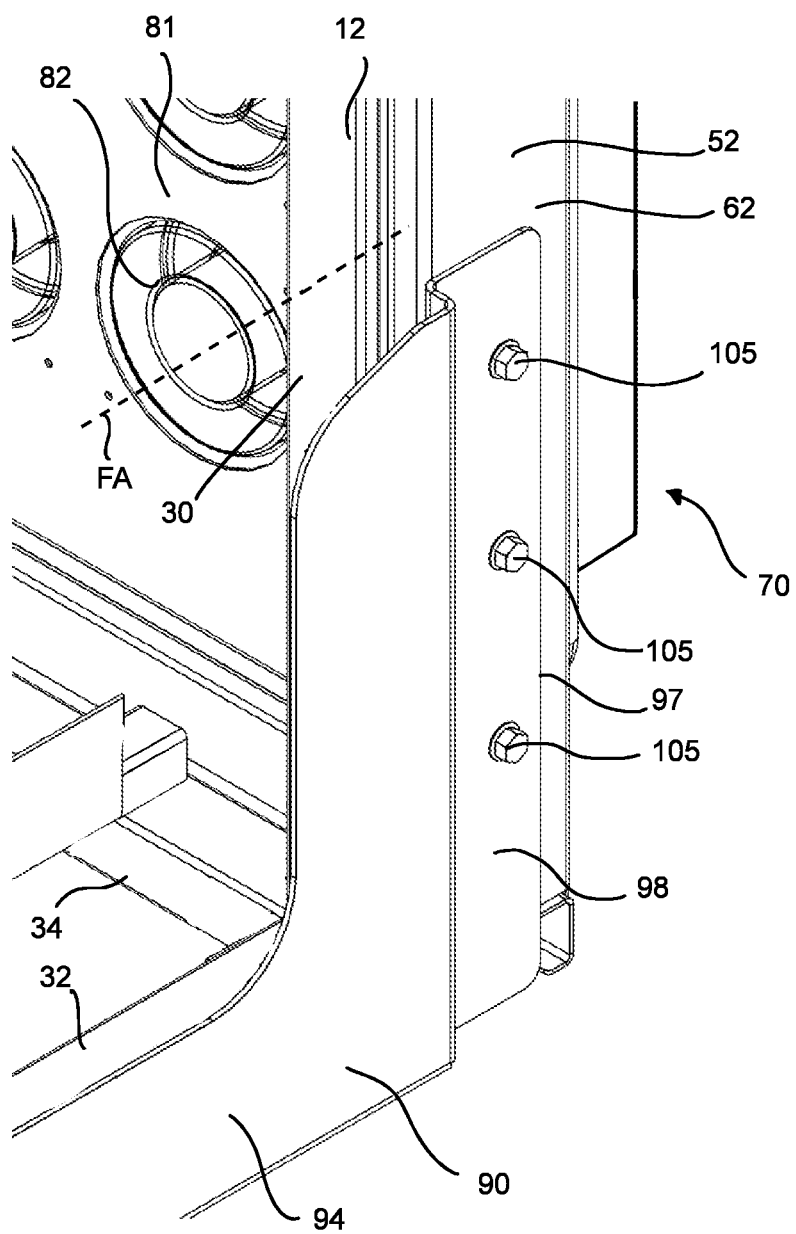
FIG. 6 is a perspective view, taken from a top, front, left side, of part of the rack system of FIG. 1.

In order to connect the lower bracket 90 to the chassis 52, in this embodiment, the lower bracket 90 has a connection flange 98 which extends rearward from the outer guiding wall 94 and defines a rear end 97 of the lower bracket 90. The connection flange 98 is configured to be connected to a lower end portion of the chassis 52, namely to the lower end portion of the left vertical chassis portion 62. The connection flange 98 defines a plurality of openings 99 for receiving fasteners 105 (FIG. 6) therein that are threadedly received by corresponding fasteners (e.g., nuts) on an inner lateral side of the left vertical chassis portion 62.

In this embodiment, each lower bracket 90 is a single-piece component formed from a continuous material. More specifically, the lower bracket 90 is made from a single piece of sheet metal that is bent into shape. For instance, a thickness of the walls 92, 94, 96 of the lower bracket 90 may measure no more than 5 mm. For example, in this embodiment, the thickness of the walls 92, 94, 96 is approximately 3 mm (i.e., between 2 and 4 mm). Notably, the thinness of the supporting wall 92 of the lower bracket 90 may be helpful to allow the supporting wall 92 to be slid under the feet 39 of the rack 10.

Furthermore, in this embodiment, the lower bracket 90 is configured to extend along at least a majority of a depth of the rack 10 measured from the front end 14 to the rear end 16 of the rack 10. Notably, as shown in FIG. 2, the length of the lower bracket 90 is such that, when the cooling assembly 50 is installed on the rack 10, the front end 91 of the lower bracket 90 is close to the rear end 16 of the rack 10.

Figure 14:
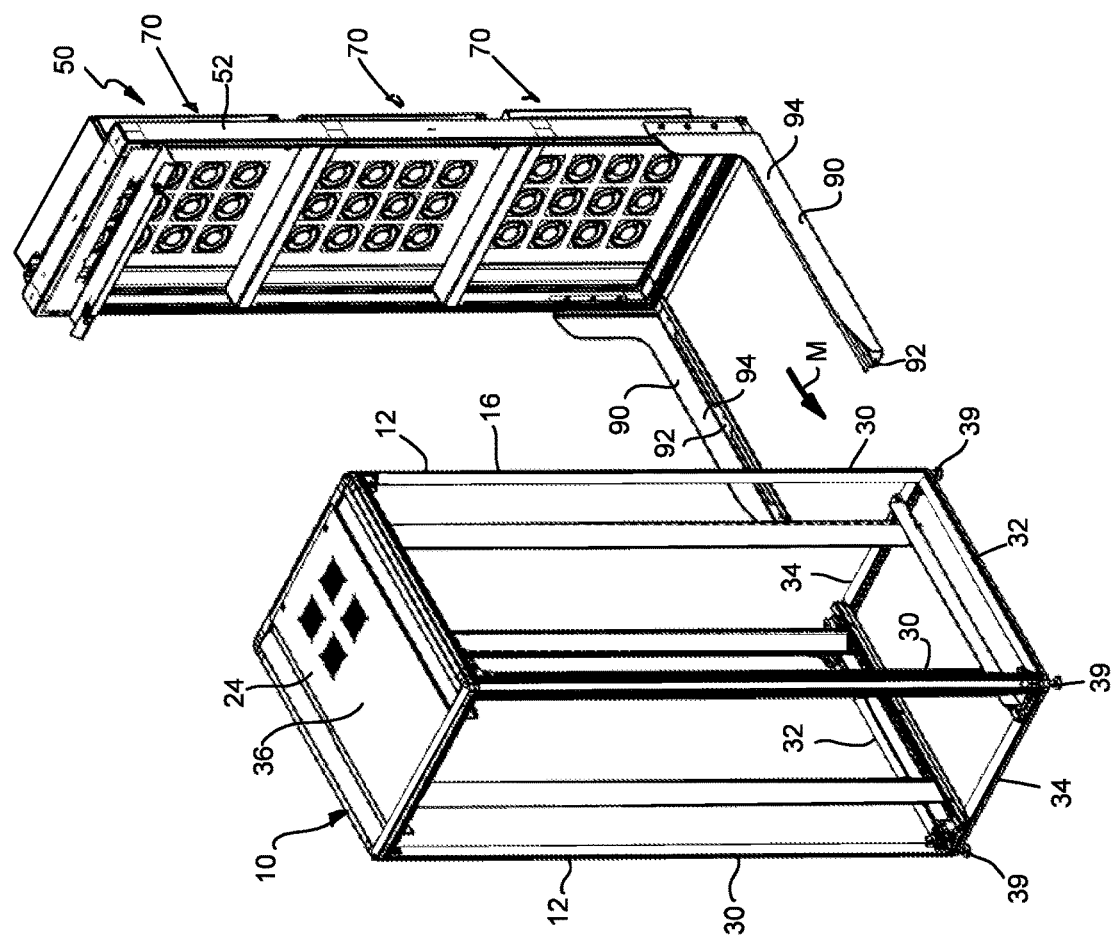
FIG. 14 is a perspective view, taken from a top, front, left side, of the rack and the cooling assembly of the rack system of FIG. 1 shown disconnected from one another.

A method for assembling the rack system 100 will now be described in more detail with reference to FIG. 14. The rack 10 is initially provided on the support surface 155 such that the feet 39 thereof are in contact with the support surface 155. As shown in FIG. 14, the cooling assembly 50 is provided on the support surface 155 positioned with the front side of the cooling assembly 50 facing the rear side of the rack 10. In other words, the lower brackets 90 are pointed toward the rear side of the rack 10. The cooling assembly 50 is then moved forward (as depicted by the arrow M in FIG. 14) until the chassis 52 of the cooling assembly 50 abuts the rear end 16 of the rack 10. In this embodiment, as the cooling assembly 50 abuts the rear end 16 of the rack 10, a sealing member 65 (FIG. 8) such as a foam joint disposed on a front face 55 of the chassis 52 forms a seal with the rack 10 along a majority of the rear end 16 thereof to limit air flow leaks at the interface between the chassis 52 and the rear end 16 of the rack 10.

As the cooling assembly 50 is moved forward, the lower brackets 90 slide underneath the lower end 24 of the rack 10. In particular, the channels 95 receive the feet 39 of the rack 10 therein such that the supporting walls 92 of the lower brackets 90 slide underneath the feet 39 of the rack 10 to affix the cooling assembly 50 to the rack 10 and thereby form the rack system 100. More specifically, the feet 39 of the rack 10 apply the weight of the rack 10 onto the supporting walls 92 of the lower brackets 90 which ensures that the cooling assembly 50 remains in its upright position shown in FIGS. 1 to 3. Therefore, as will be understood, the cooling assembly 50 is easily installed onto the rack 10 and allows retrofitting an existing rack 10 with the cooling assembly 50 if the need arises (e.g., to address a hot spot within the data center).

The upper abutting assembly 84 can then be adjusted as described above to limit air flow at the interface between the upper abutting assembly 84 and the upper end 22 of the rack 10. As such, the cooling assembly 50 is adjustable adapted to the size of the rack 10.

In some embodiments, in addition to or instead of having the lower end 24 of the rack 10 supported atop the lower brackets 90, the lower brackets 90 may be secured to the support surface 155 of the data center. For example, in some embodiments, prior to placing the rack 10 atop the lower brackets 90, the lower brackets 90 may be anchored to the support surface 155 such as to fix the cooling assembly 50 in place. Notably, fasteners may be inserted through the slots 93 of the supporting walls 92 to affix the lower brackets 90 to the support surface 155. The lower end 24 of the rack 10 would then be positioned atop the supporting walls 92 of the lower brackets 90. As such, the cooling assembly 50 may pre-define the position of the rack 10 within the data center.

While in this embodiment, two lower brackets 90 are provided on opposite sides of the chassis 52, it is contemplated that, in other embodiments, the cooling assembly 50 could have a single lower bracket. For instance, the single lower bracket could span the width of the chassis 52 to be similarly connected to each side of the chassis 52.

As will be understood from the above, the lower brackets 90 can facilitate retrofitting the rack 10 with a system for cooling air discharged by the rack 10. Notably, if an operator realizes that additional cooling may be desirable for the air discharged by a given rack 10, the operator may retrofit the rack 10 with the cooling assembly 50 simply by sliding the lower brackets 90 under the lower end 24 of the rack 10 as described above. Alternatively, the cooling assembly 50 may be installed within the data center (e.g., affixed to the support surface 155) prior to installation of the rack 10. This may also facilitate handling of the rack 10 as it does not have to be transported with the cooling assembly 50 attached thereto. Moreover, the lower brackets 90 are relatively easy to manufacture and is therefore cost-efficient to manufacture.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A cooling assembly for a data center rack, comprising:
a chassis having an upper end and a lower end spaced apart from one another in a vertical direction;
at least one heat exchanger connected to the chassis, the at least one heat exchanger being disposed vertically at least in part between the upper and lower ends of the chassis, each of the at least one heat exchanger comprising:
a cooling coil for circulating a cooling fluid therethrough; and
a plurality of fins connected to the cooling coil, the fins being spaced from one another to allow air flow therebetween;
and
at least one lower bracket connected to a lower end portion of the chassis, each of the at least one lower bracket being a single piece of sheet metal bent into shape and comprising a supporting wall extending frontward from the lower end portion of the chassis, the supporting wall being configured to receive at least in part a lower end of the data center rack thereon such that, in use, the supporting wall is disposed between the lower end of the data center rack and a support surface.

2. The cooling assembly of claim 1, wherein each of the at least one lower bracket further comprises a guiding wall extending generally perpendicular to the supporting wall, the guiding wall being configured to guide a lateral position of the data center rack relative to the cooling assembly.

3. The cooling assembly of claim 2, wherein each of the at least one lower bracket further comprises a connection flange extending rearwardly from the guiding wall and defining a rear end of the lower bracket, the connection flange being configured to be connected to the chassis.

4. The cooling assembly of claim 2, wherein:
the guiding wall has a rear end portion and a front end portion, the rear end portion being closer to the chassis than the front end portion; and
the guiding wall is generally L-shaped such that the rear end portion of the guiding wall extends vertically higher than the front end portion of the guiding wall.

5. The cooling assembly of claim 2, wherein the at least one lower bracket comprises a left lower bracket and a right lower bracket laterally spaced apart from one another.

6. The cooling assembly of claim 5, wherein:
the guiding wall of each of the left and right lower brackets comprises an inner lateral surface;
the inner lateral surfaces of the guiding walls of the left and right lower brackets face one another; and
a distance between the inner lateral surface of the guiding wall of the left lower bracket and the inner lateral surface of the guiding wall of the right lower bracket is configured to be greater than a rack width of the data center rack.

7. The cooling assembly of claim 1, wherein the at least one lower bracket is configured to be slid under the lower end of the data center rack.

8. The cooling assembly of claim 7, wherein the supporting wall of the at least one lower bracket has a thickness of no more than 5 mm.

9. The cooling assembly of claim 1, wherein, in use, the upper end of the chassis is configured to be disposed vertically higher than an upper end of the data center rack.

10. The cooling assembly of claim 1, further comprising:
an upper abutting assembly connected to the chassis near the upper end thereof,
the upper abutting assembly being configured to abut the data center rack at an upper end of the data center rack to form a seal at an interface between the upper abutting assembly and the upper end of the data center rack,
a position of the upper abutting assembly being adjustable to adapt the cooling assembly to the data center rack.

11. The cooling assembly of claim 10, wherein the upper abutting assembly comprises at least one adjuster for adjusting an angular orientation of the upper abutting assembly to selectively form a seal at the interface between the upper abutting assembly and the upper end of the data center rack.

12. The cooling assembly of claim 1, further comprising at least one fan connected to a corresponding one of the at least one heat exchanger, the at least one fan being configured to promote air flow through the corresponding one of the at least one heat exchanger.

13. The cooling assembly of claim 1, wherein the at least one lower bracket is configured to be fastened to the support surface.

14. The cooling assembly of claim 1, wherein the at least one heat exchanger is hingedly connected to the chassis and is pivotable relative thereto about a vertical axis.

15. The cooling assembly of claim 1, wherein the at least one heat exchanger comprises three heat exchangers vertically spaced from one another.

16. A rack system for a data center, comprising:
a data center rack having an upper rack end and a lower rack end, the data center rack comprising a rack frame and defining at least one housing section configured to house electronic equipment therein; and
the cooling assembly of claim 1, at least part of the lower end of the data center rack being disposed atop the supporting wall of the at least one lower bracket.

17. The rack system of claim 16, wherein a weight of the data center rack supported by the at least one lower bracket keeps the cooling assembly upright.

18. The rack system of claim 16, wherein:
the data center rack has a depth measured between a front end and a rear end of the data center rack; and
the at least one lower bracket extends in a front-to-rear direction along at least a majority of the depth of the data center rack.

19. A method for assembling a rack system, the method comprising:
positioning a cooling assembly according to claim 1 on a support surface on a rear side of a data center rack; and
moving the cooling assembly relative to the data center rack to slide the supporting wall of the at least one lower bracket of the cooling assembly underneath a lower end of the data center rack to affix the cooling assembly to the data center rack.

20. The method of claim 19, further comprising adjusting a position of an upper abutting assembly of the cooling assembly to abut an upper end of the data center rack to limit air flow at an interface between the upper abutting assembly and the data center rack.

\* \* \* \* \*